United States Patent [19]

Harvey

[11] 3,970,932
[45] July 20, 1976

[54] HOT LINE DETECTION SYSTEM FOR HIGH VOLTAGE SWITCHGEAR

[75] Inventor: Horace A. Harvey, Trevose, Pa.

[73] Assignee: I-T-E Imperial Corporation, Spring House, Pa.

[22] Filed: Sept. 3, 1974

[21] Appl. No.: 502,546

[52] U.S. Cl. .............................. 324/133; 174/11 BH
[51] Int. Cl.² ............................................ G01R 19/16
[58] Field of Search .............. 324/51, 54, 126, 133, 324/127, 102; 174/11 BH, 142, 143; 340/253 A, 253 P, 255

[56] References Cited
UNITED STATES PATENTS

| | | | |
|---|---|---|---|
| 1,657,249 | 1/1928 | Eby .................................. | 174/142 X |
| 2,657,650 | 4/1972 | Arndt .............................. | 324/133 X |
| 2,794,169 | 5/1957 | Gooding .......................... | 324/54 |
| 2,808,566 | 10/1957 | Douma ............................ | 324/127 |
| 3,068,409 | 12/1962 | Bigliano et al. ................. | 324/126 X |
| 3,469,223 | 9/1969 | Leonard .......................... | 174/11 BH |
| 3,524,133 | 8/1970 | Arndt .............................. | 324/133 X |
| 3,538,440 | 11/1970 | Galloway ........................ | 324/133 |
| 3,612,994 | 10/1971 | Hooper ............................ | 324/54 |
| 3,710,241 | 1/1973 | Dineen ............................. | 324/54 |
| 3,769,578 | 10/1973 | Staley .............................. | 324/54 |

FOREIGN PATENTS OR APPLICATIONS 629,162   9/1949   United Kingdom .................. 324/54

*Primary Examiner*—Gerard R. Strecker
*Attorney, Agent, or Firm*—Ostrolenk, Faber, Gerb & Soffen

[57] ABSTRACT

An insulation housing has a central opening to allow the housing to be mounted on a high voltage conductor. A continuous, circular cylindrical electrode band is embedded within the housing and is capacitively coupled to a conductor which passes through the central opening of the housing. The electrode may be the sole electrical component encapsulated within the housing. The lead from the electrode is then coupled to indicators which are fixed on remotely positioned switchgear cubicles. The indicators include neon glow bulbs and a solid state relay which are operated by the energy derived from the capacitive pickup structure.

3 Claims, 4 Drawing Figures

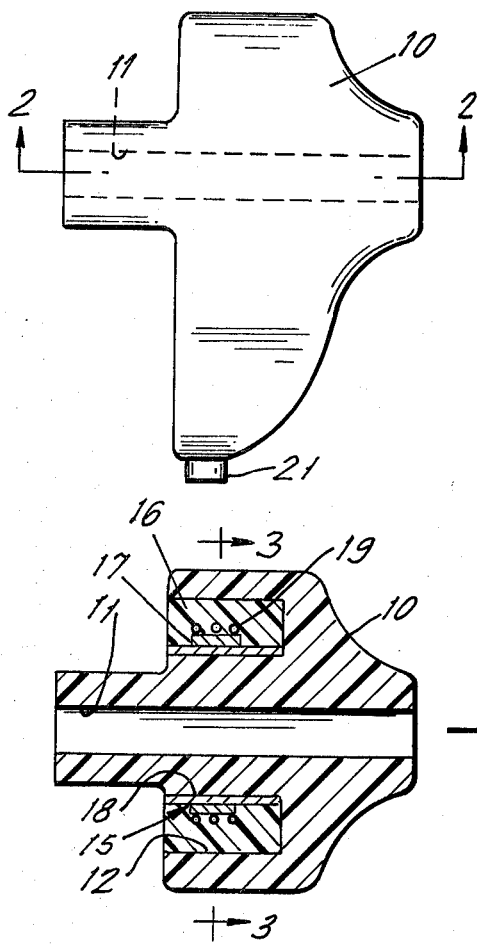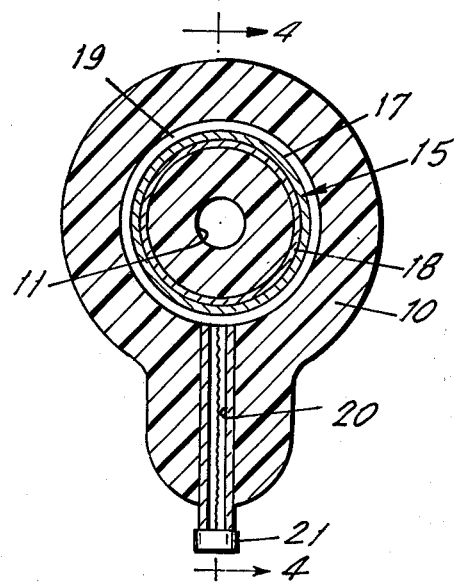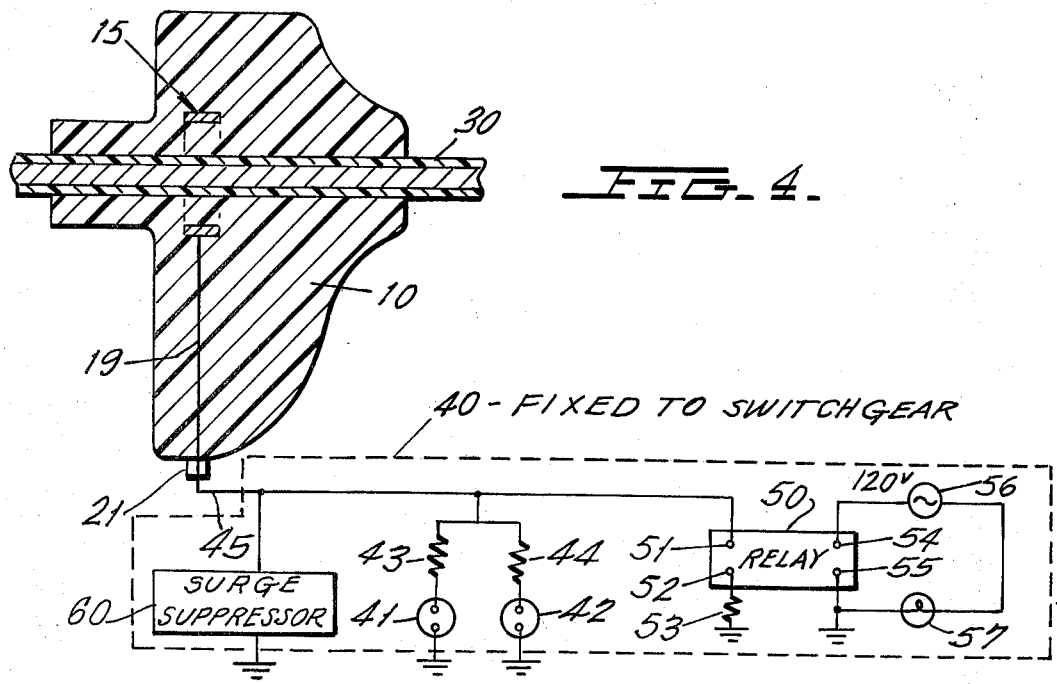

3,970,932

HOT LINE DETECTION SYSTEM FOR HIGH VOLTAGE SWITCHGEAR

BACKGROUND OF THE INVENTION

This invention relates to hot line detection devices, and more specifically relates to an inexpensive and reliable novel hot line detection system for switchgear in which hot line indicators are mounted on the stationary switchgear. Hot line detection systems are well known in the electric power field. Such systems frequently incorporate glow lamps which are mounted on the conductor being monitored, and the glow lamp glows visibly when the conductor is energized. This system is limited to applications where the conductor and lamp can be easily viewed. However, if the conductor is in enclosed equipment, as in the case of metalclad switchgear, viewing windows must be provided and ease of viewing is limited and no remote signaling is provided.

Another common arrangement for hot line detection uses a conventional potential transformer which is connected in the system to produce output voltages for indicator devices and relaying and the like. Potential transformers, however, are expensive and bulky and the system becomes subject to spurious signal outputs due to blown primary and secondary fuses and inadvertently disconnected devices.

Other known arrangments are capacitive type pickup systems in which a conductive probe is mounted on one end of a long pole and is electrically connected to a glow lamp or the like on the pole. When the probe at the end of the pole is placed close to an energized line, the glow lamp will turn on. Typical systems of this kind are described, for example, in U.S. Pat. No. 3,287,642.

The disadvantages of such systems is that continuous indication is not available and they require periodic action by maintenance personnel. Moreover, only on-site indication is given.

Still further systems have been suggested which provide hot line detection wherein conductive plates have been built into other equipment which serve other purposes than a hot line detection purpose. Thus, in the U.S. Pat. No. to Waehner 3,343,153, an arrangement is disclosed in which a glow lamp is fixed to an electrode embedded in a cable indicator, thereby to indicate whether or not the cable is energized. This arrangement has the disadvantage previously discussed that the glow lamp may not be easily visible especially when the equipment is contained in enclosed housings.

BRIEF SUMMARY OF THE PRESENT INVENTION

In accordance with the present invention, an insulation housing is especially adapted for carrying either a single cylindrical electrode or an electrode and a current transformer assembly and the housing is adapted to be mounted directly and permanently on a high voltage conductor. Permanent wiring to indicating devices mounted directly on a stationary switchgear cubicle is then electrically connected to the electrode to provide a continuously viewable indication of the state of energization of the conductor. Thus, a continuous indication is provided even though the conductor may be removed from sight or is enclosed by the switchgear. Moreover, the housing device is relatively inexpensive in comparison to a potential transformer or the like since it simply houses a single conductive band or a band with other components.

The indicating equipment, which can be fixedly mounted on the switchgear cubicle, may include one or more glow lamps which are excited by the energy derived from the conductive electrode which is capacitively coupled to the energized line, and can further include input terminals to a solid state relay which can operate further local or remote indicating devices or metering and control devices.

Thus, the system of the present invention eliminates most of the objectionable features of commonly used hot line detection systems while the system is extremely reliable and simple and is low in cost.

BRIEF DESCRIPTION OF THE DRAWINGS

FIG. 1 is a plan view of the insulation housing which houses a single electrode in accordance with the invention.

FIG. 2 is a cross-sectional view of the housing of FIG. 1 taken across the section line 2—2 in FIG. 1.

FIG. 3 is a cross-sectional view of FIG. 2 taken across the section line 3—3 in FIG. 2.

FIG. 4 schematically illustrates the housing of FIG. 1 as it would be seen in section line 4—4 in FIG. 3 in connection with a remotely positioned indicator arrangement which is fixedly mounted on schematically illustrated switchgear.

DETAILED DESCRIPTION OF THE DRAWINGS

Referring now to the drawings, each show an insulation housing 10 which is a precast epoxy housing of the type which has been used in the past for housing a current transformer. The precast housing has a central opening 11 therethrough and is intentionally cast with an open annular chamber 12 (FIG. 2). When the housing 10 is used as a current transformer, the current transformer core and secondary winding are loaded into this open chamber 12 and are then potted therein by filling the chamber with a suitable potting insulation medium.

This same pre-existing shell is adapted for the manufacture of the novel pickup device of the present invention by forming a cylindrical conductive electrode 15 on the interior surface of the channel 12 and thereafter potting the channel in the usual manner by filling with potting medium 16 (FIG. 2). Thus, the electrode 15 becomes totally encapsulated within the insulation housing 10–16.

The conductive electrode 15 may consist of a thin lead foil 17 which may have a length of about 1 inch and a diameter of about 2 inches. Preferably, the interior surface of the cavity 12 is coated with a conductive band 18 in order to prevent corona discharge from foil 17 to the interior surface of insulator 10. That is, conductive band 18 ensures a good air-free contact between the interior surface of the cavity 12 and the foil 17. The foil 17 then has a lead wire 19 wrapped thereon, with the lead wire 19 making contact to foil 17 and extending through the lead tube 20 to an external terminal 21 in the insulation housing 10. This completes the construction of the pickup device, with the device being capable of receiving a high voltage insulated conductor 30 as shown in FIG. 4, where conductor 30 may be at 5,000 volts or more with respect to ground voltage.

The construction of the cylindrical electrode 15, which is circular in cross-section in FIG. 3, but can take any desired shape, and the housing 10 therefor have been found to be capable of having the necessary voltage characteristics required for 15,000 volt switchgear. Moreover, the device has a 95 KV BIL level under impulse testing.

FIG. 4 illustrates the manner in which the device of FIGS. 1, 2 and 3 can be associated with indicator equipment which is fixed on the high voltage switchgear associated with conductors such as conductor 30. Thus, the dotted-line block 40 schematically illustrates the compartment of the stationary switchgear housing which may enclose conductor 30 and housing 10 where the fixed switchgear receives two neon glow lamps 41 and 42 and their respective ballast resistors 43 and 44, respectively, as on its front panel. Note that only a single glow lamp is necessary but that two can be provided for redundancy.

The glow lamps 41 and 42 may be of any desired type and typically may be type N2E neon lamps while resistors 43 and 44 may be 84K OHM ¼ watt resistors. The two lamps 41 and 42 each have one terminal connected to ground and their other terminal connected to lead wire 45 which is wired by appropriate wiring arrangements to the terminal 21. Note that the glow lamps 41 and 42 will be continuously displayed on the switchgear cubicle to continuously indicate the energized condition of conductor 30. Note further that other glow lamps may be provided for the other phases of the system in a manner identical to that described for FIG. 4 for one of the phases.

The output signal on line 45 may be further used to operate relaying equipment such as the solid state relay 50 which can also be mounted in a fixed position at the switchgear housing. The relay 50 has input terminals 51 and 52 which are connected to lead 45 and to ground through ground resistor 53. Output terminals 54 and 55 of relay 50 may be connected in series with a low voltage control power source 56 and a large indicating lamp 57 which can have essentially any desired type capacity, for example, a 100 watt lamp. Any commercially available solid state relay can be used for the relay 50. One relay which was used and which performed acceptably was the Teledyne relay catalog No. 61A-1481-11Z and the resistor 53 was a 300K-OHM resistor. Relay 50 may also be used as the device to trigger indicators for supervisory control systems and remote indicators.

In tests performed on the system of FIG. 4, where the switchgear was 15,000 volt switchgear, it was found that, when the voltage of bus 30 reached 3,100 volts, the relay 50 closed. At this point, the voltage from line 45 to ground was 31 volts. As the voltage on conductor 30 was increased, the lamps 41 and 42 ignited when the bus voltage reached 12,000 volts, at which point the voltage on line 45 to ground was 110 volts. It was further found that, by disconnecting one of the lamps 41 or 42, the relay pickup remained relatively constant while lamp ignition of the remaining lamp took place at about 5,200 volts on the bus 30 which corresponded to about 49 volts from line 45 to ground.

As a further safety feature, a voltage limiting device 60 may be securely connected from terminal 21 to ground. This device will assure that, even if all other ground connections to the various indicators become disconnected, the voltage of conductor 45 will not rise above ground to an excessive level. For example, the voltage of conductor 45 can be clamped to a maximum of about 150 volts. Any conventional surge suppressor or other voltage limiting component can be used for this purpose.

Although preferred embodiments of this invention have been described, many variations and modifications will now be apparent to those skilled in the art. Therefore, this invention is to be limited, not by the specific disclosure herein, but only by the appended claims.

The embodiments of the invention in which an exclusive privilege or property is claimed are defined as follows:

1. A hot line detector for connection to high voltage lines comprising, in combination:
    a housing formed entirely of an insulating material having a substantially invarient dielectric constant and having an opening therethrough for receiving a continuous length of energizable conductor, said housing having an annular chamber formed therein concentric with said opening;
    a conductive coating formed on the interior surface of said chamber;
    a conductive foil surrounding and in contact with said coating for defining a single cylindrical conductive electrode embedded in said insulation housing and surrounding said opening, said cylindrical conductive electrode being the sole electrical conductive device within said insulation housing;
    a mass of insulation potting material filling said annular chamber to encapsulate said conductive electrode therein;
    a lead wire leading through said insulation housing and being exposed at one end at the exterior surface of said insulation housing for connection to an exterior circuit, said lead wire being connected at its other end to said cylindrical conductive electrode;
    indicating circuit means at a location remote from said housing for indicating the presence of a conductor at a voltage in excess of a given voltage in said insulation housing by the capacitive coupling between said cylindrical conductive electrode and a conductor which passes through said cylindrical conductive electrode; and
    remote connection means permanently connecting said one end of said lead wire to said remote indicating circuit means.

2. The device of claim 1 wherein said indicating circuit means includes a glow lamp which is excited from the output voltage on said cylindrical electrode.

3. A hot line detector for remotely monitoring conductors of switchgear apparatus which have a high voltage such as 15,000 volts; said switchgear apparatus including stationary metal cubicles having indicating circuit means thereon for indicating the energization of at least one high voltage conductor associated with said switchgear apparatus at a voltage in excess of a given voltage, said at least one high voltage conductor being positioned at a location remote from said cubicles; said hot line detector comprising a housing formed entirely of an insulating material having a substantially invariant dielectric constant and having an opening therethrough, wherein said at least one high voltage conductor extends through said opening, said housing having an annular chamber formed therein concentric with said opening; a conductive coating formed on the interior surface of said chamber; a conductive foil surrounding and in contact with said coating for defining a single cylindrical conductive electrode embedded in said insulation housing and surrounding said opening, said cylindrical conductive electrode being the only electrical conductive device in said housing; a mass of insulation potting material filling said annular chamber to encapsulate said conductive electrode therein; a lead wire extending through said insulation housing and being continuously exposed at one end at the exterior surface of said insulation housing for connection to an exterior circuit, said lead wire being connected to said cylindrical conductive electrode at its other end; and connection wire means for connecting said one end of said lead wire to said indicating circuit means, whereby said indicating circuit means is operable to an indicating condition by voltage derived from said conductive electrode through the capacitive coupling between said conductive electrode and said at least one high voltage conductor.

* * * * *